(12) United States Patent
Arai et al.

(10) Patent No.: US 6,199,568 B1
(45) Date of Patent: Mar. 13, 2001

(54) TREATING TANK, AND SUBSTRATE TREATING APPARATUS HAVING THE TREATING TANK

(75) Inventors: Kenichiro Arai; Hajime Shirakawa, both of Shiga-ken (JP)

(73) Assignee: Dainippon Screen Mfg. Co., Ltd., Kyoto (JP)

( * ) Notice: Subject to any disclaimer, the term of this patent is extended or adjusted under 35 U.S.C. 154(b) by 0 days.

(21) Appl. No.: 09/174,459

(22) Filed: Oct. 19, 1998

(30) Foreign Application Priority Data

Oct. 20, 1997 (JP) .................................................. 9-286726
Nov. 4, 1997 (JP) .................................................. 9-301680

(51) Int. Cl.⁷ .................................................. B08B 3/04
(52) U.S. Cl. ........................... 134/186; 134/198; 134/902
(58) Field of Search ..................... 134/198, 186, 134/902, 182, 155; 239/553, 556, 553.5, 557, 562, 566, 547, 546, 550, 554, 558, 590, 543, 559

(56) References Cited

U.S. PATENT DOCUMENTS 4,599,966 * 7/1986 Lymn ..................... 134/902
5,000,206 * 3/1991 Kramer et al. . .
5,014,727 * 5/1991 Aigo . .
5,069,235 * 12/1991 Vetter et al. . .
5,520,205 * 5/1996 Guldi et al. . .
5,901,716 * 5/1999 Hwang et al. . .
5,927,302 * 7/1999 Hayami et al. . .

* cited by examiner

*Primary Examiner*—Frankie L. Stinson
(74) *Attorney, Agent, or Firm*—Arent Fox Kintner Plotkin & Kahn PLLC

(57) ABSTRACT

A treating tank includes injection pipes for injecting a treating liquid. Each injection pipe has a closed distal end, and a plurality of jet bores arranged along a side wall thereof for jetting, into the treating tank, the treating liquid introduced through a proximal end. Each injection pipe includes a liquid jetting pipe portion defining the jet bores and having an inside diameter larger than a bore diameter of a liquid inlet formed at the proximal end for introducing the treating liquid into the liquid jetting pipe portion. This construction provides a uniform head length of the treating liquid jetting from the jet bores into the treating tank to effect uniform treatment of substrates in the treating tank. Where each injection pipe includes a sloping pipe portion having an inside diameter gradually increasing from the liquid inlet to the liquid jetting pipe portion, a higher degree of uniformity is achieved for the head length of the treating liquid jetting from the jet bores into the treating tank. Each jet bore may include a slope portion having an inside diameter gradually decreasing from an inner wall toward an outside of the liquid jetting pipe portion.

10 Claims, 17 Drawing Sheets

TREATING TANK, AND SUBSTRATE TREATING APPARATUS HAVING THE TREATING TANK

BACKGROUND OF THE INVENTION (1) Field of the Invention

The present invention relates to a treating tank for treating substrates as immersed in a treating liquid, and a substrate treating apparatus having the treating tank. More particularly, the invention relates to an improvement in treating liquid injection pipes attached to the treating tank.

(2) Description of the Related Art

This type of treating tank requires streams of a treating liquid to be formed therein. For this purpose, as shown in FIGS. 1A through 1C, a treating tank 110 includes treating liquid injection pipes 103 disposed adjacent the bottom thereof. Each injection pipe 103 has a closed distal end 100, and numerous treating liquid jet bores 102 arranged along a side wall for jetting a treating liquid introduced through a proximal end 101 out into the treating tank 110. Conventionally, as shown in the drawings, each injection pipe 103 is formed of a single pipe having a constant inside diameter id from the proximal end 101 to the distal end 100. The jet bores 102 formed in each injection pipe 103 have the same cylindrical shape and size. These bores 102 are formed, for example, by drilling each injection pipe 103 from the outer wall thereof.

The treating liquid is supplied from a treating liquid source 130 to the proximal ends 101 of injection pipes 103 through a treating liquid supply pipe 120. Each injection pipe 103 has, at the proximal end 101 thereof, a liquid inlet 101a for introducing the treating liquid into a pipe portion (liquid jetting pipe portion) 104 defining the jet bores 102, and a joint 101b for coupling to the supply pipe 120.

The treating tank 110 supports a plurality of wafers W arranged therein. These wafers W receive a predetermined treatment as immersed in the treating liquid jetting from the jet bores 102 of injection pipes 103 and forming upward streams throughout the treating tank 110.

In an etching process, for example, a plurality of wafers W are immersed in deionized water jetting from the jet bores 102 of injection pipes 103 and filling the treating tank 110. Then, a chemical solution such as of hydrofluoric acid having etching action is jetted from the jet bores 102 of injection pipes 103 to replace the deionized water in the treating tank 110.

The chemical solution is jetted from the jet bores 102 of injection pipes 103 to form streams of the chemical solution throughout the treating tank 110. In this way, the deionized water is efficiently replaced by the chemical solution in the treating tank 110.

However, the treating liquid injection pipes 103 used conventionally have a drawback that marked variations occur in the head length of the treating liquid jetting from the jet bores 102. As shown in FIG. 2, the head lengths wl of the treating liquid jets increase gradually from the jet bore 102 adjacent the proximal end 101 to the jet bore 102 adjacent the distal end 100 of each injection pipe 103. FIG. 2 schematically shows results of an experiment carried out by using injection pipes 103 having an inside diameter id of 16 mm, and introducing the treating liquid at a flow rate of 10 l/min. through the liquid inlets 101a. Line wlt in FIG. 2 represents a head length of the treating liquid jetting from the jet bores 102 closest to the distal ends 100.

Thus, in an etching process performed in the conventional treating tank 110, for example, the deionized water cannot be replaced uniformly by the chemical solution in the treating tank 110 because of the variations in the head length wl of the treating liquid jetting from the jet bores 102. As shown in FIG. 1B, for example, when a plurality of wafers W are treated simultaneously as immersed in the treating liquid, the wafers W arranged adjacent the distal ends 100 and those arranged adjacent the proximal ends 101 of treating liquid injection pipes 103 are etched in different amounts. With such variations, it has been impossible to treat the wafers W uniformly.

SUMMARY OF THE INVENTION

The present invention has been made having regard to the state of the art noted above, and its object is to provide a treating tank, and a substrate treating apparatus having the treating tank, for treating substrates uniformly in the treating tank.

The above object is fulfilled, according to a first aspect of the present invention, by a treating tank for immersing substrates in a treating liquid, comprising injection pipes each having a closed distal end, and a plurality of jet bores arranged along a side wall thereof for jetting, into the treating tank, the treating liquid introduced through a proximal end. Wherein each of the injection pipes includes a liquid jetting pipe portion defining the jet bores and having an inside diameter larger than a bore diameter of a liquid inlet formed at the proximal end for introducing the treating liquid into the liquid jetting pipe portion.

In the above treating tank according to the first aspect of the invention, each injection pipe attached to the treating tank includes a liquid jetting pipe portion defining jet bores and having an inside diameter larger than a bore diameter of a liquid inlet formed at the proximal end for introducing the treating liquid into the liquid jetting pipe portion. This construction suppresses variations in the dynamic pressure of the treating liquid in the liquid jetting pipe portion. As a result, substantially the same static pressure of the treating liquid occurs in the jet bores (i.e. jet pressure of the treating liquid from the jet bores). Variations in the head length of the treating liquid jetting from the jet bores are suppressed effectively, compared with the injection pipes used conventionally. Thus, the treating liquid jets from the jet bores into the treating tank with a uniform condition to perform a more uniform treatment of substrates than the conventional treating tank.

In the treating tank according to the first aspect of the invention, each of the injection pipes may further include a sloping pipe portion having an inside diameter gradually increasing from the liquid inlet to the liquid jetting pipe portion.

The sloping pipe portion noted above is effective to suppress turbulence of the treating liquid flowing from the liquid inlet into the liquid jetting pipe portion. Variations in the head length of the treating liquid jetting from the jet bores adjacent the proximal end also are suppressed while reducing the length of the liquid jetting pipe portion as much as possible. The treating liquid jetting from all the jet bores has further uniformed head lengths. With the suppression of turbulence occurring in the treating liquid flowing from the liquid inlet into the liquid jetting pipe portion, overall variations in the head length of the treating liquid jetting from the jet bores may be suppressed more effectively than with the injection pipe having no such sloping portion. Consequently, the treating liquid jets from the jet bores into the treating tank with a further uniformed condition. This construction assures treatment of substrates with increased uniformity.

The sloping pipe portion may have an inside diameter increasing in a curve from the liquid inlet to the liquid jetting pipe portion, or linearly from the liquid inlet to the liquid jetting pipe portion.

In a second aspect of the invention, a treating tank for immersing substrates in a treating liquid comprises injection pipes each having a closed distal end, and a plurality of jet bores arranged along a side wall thereof for jetting, into the treating tank, the treating liquid introduced through a proximal end, wherein each of the jet bores includes a slope portion having an inside diameter gradually decreasing from an inner wall toward an outside of each injection pipe.

In the above treating tank according to the second aspect of the invention, each jet bore includes a slope portion having an inside diameter gradually decreasing from an inner wall toward an outside of each injection pipe. With this construction, each jet bore has an inside diameter at an inlet formed in the inner pipe wall larger than an inside diameter at an outlet formed in the outer pipe wall. Thus, the treating liquid flows easily into each jet bore inlet, thereby suppressing variations in the pressure of the treating liquid jetting from the jet bores. As a result, variations in the head length of the treating liquid jetting from the jet bores are suppressed, compared with the injection pipe used conventionally.

The treating liquid flowing into each jet bore inlet formed in the inner wall of the injection pipe has varied directions. Where each jet bore has a simple cylindrical shape as in the injection pipe used conventionally, the streams flowing in varied directions of the treating liquid entering the jet bore inlet, without being regulated, jet from the jet bore outlet formed in the outer wall of the injection pipe. Consequently, the direction in which the treating liquid jets from the jet bore outlet into the treating tank is directly influenced by the varied directions in which the treating liquid enters the jet bore inlet. This phenomenon may cause variations in the jetting direction of the treating liquid from the jetting bore into the treating tank. Such variations in the jetting direction of the treating liquid affects the head length of the treating liquid jetting from the jetting bore into the treating tank.

In the treating tank according to the second aspect of the invention, streams flowing in varied directions of the treating liquid entering the jet bore inlet collide with the peripheral wall of the slope portion. The streams other than that following the axis of the jet bore interfere with and counterbalance one another. These streams ultimately converge to a treating liquid jetting direction in alignment with the axis of the jet bore. Variations in the direction, if any, of the treating liquid jetting from each jet bore into the treating tank are suppressed, thereby further uniforming the head lengths of the treating liquid jetting from the jet bores into the treating tank.

The slope portion may have an inside diameter decreasing linearly from the inner wall toward the outside, or in a curve from the inner wall toward the outside.

In the treating tank according to the second aspect of the invention, each of the jet bores may further include a straight portion having a constant inside diameter and communicating the slope portion with an outer wall of the liquid jetting pipe portion.

In the treating tank according to the second aspect of the invention, each of the injection pipes may act as an inner pipe mounted in an outer injection pipe having a plurality of second jet bores arranged along a side wall thereof for finally jetting the treating liquid into the treating tank, wherein the jet bores of each injection pipe mounted inside jet out the treating liquid in a direction displaced from a direction in which the treating liquid jets from the second jet bores.

According to this construction, the treating liquid jetting from the jet bores of each inner injection pipe collides with the inner wall of the outer injection pipe, whereby the flow velocity (pressure) of the treating liquid is lowered. Then, the streams are divided in two parts, each flowing around in a different direction through the space between the outer wall of the inner injection pipe and the inner wall of the outer injection pipe. The streams join in the second jet bores and jet out of the second jet bores into the treating tank. Thus, the streams of the treating liquid are further regulated after jetting from the jet bores of the inner injection pipe until jetting from the second jet bores of the outer injection pipe into the treating tank. This feature produces the effect of further uniforming the head lengths of the treating liquid jetting into the treating tank, to provide a further uniformed treatment of substrates.

The treating tank according to the first or second aspect of the invention may further comprise a support for supporting the substrates inside the treating tank. This construction allows a plurality of substrates to be treated simultaneously as immersed in the treating liquid.

The feature of the treating tank according to the second aspect may be added to the treating tank according to the first aspect.

That is, each of the injection pipes includes a liquid jetting pipe portion defining the jet bores and having an inside diameter larger than a bore diameter of a liquid inlet formed at the proximal end for introducing the treating liquid into the liquid jetting pipe portion, while each of the jet bores includes a slope portion having an inside diameter gradually decreasing from an inner wall toward an outside of each injection pipe.

This construction assures a further uniformed head length of the treating liquid jetting from the jet bores into the treating tank.

Further, a substrate treating apparatus for performing uniform treatment may be realized by employing therein the treating tank or tanks according to the first or second aspect of the invention.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Figure 1A:
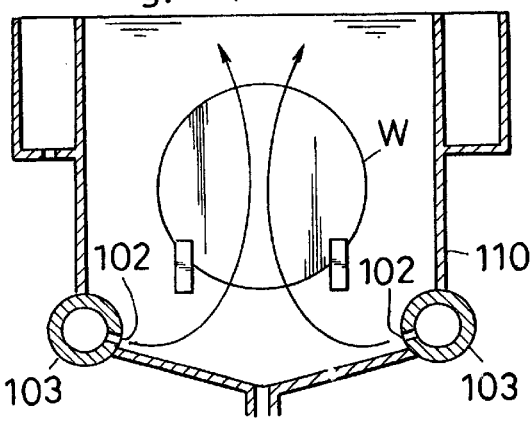
FIG. 1A is a view in vertical section of a conventional treating tank.
Figure 1B:
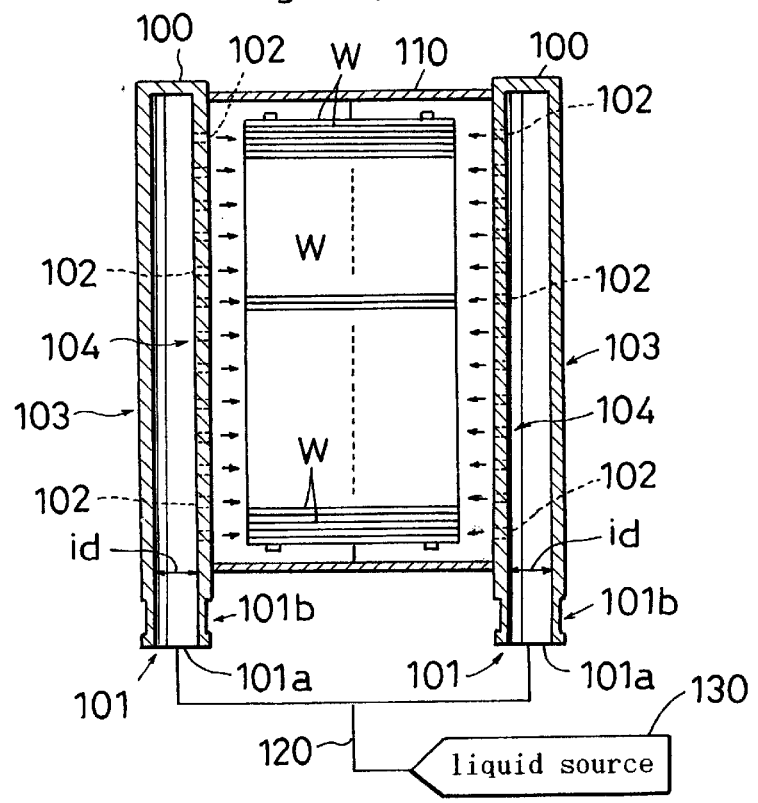
FIG. 1B is a view in cross section of the conventional treating tank.
Figure 1C:
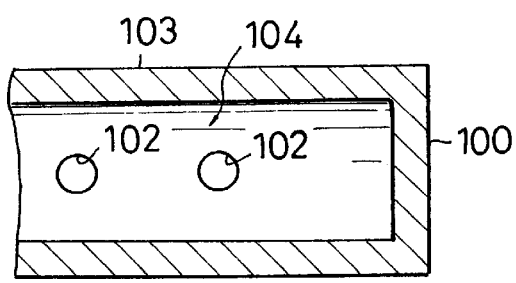
FIG. 1C is a view, seen from inside, of treating liquid jet bores of an injection pipe attached to the conventional treating tank.

Preferred embodiments of the present invention will be described in detail hereinafter with reference to the drawings.

First Embodiment

A first embodiment will be described first with reference to FIGS. 3 through 6.

The drawings show a treating tank 30 which is approximately box-shaped, with a bottom 30a dented in the middle to look V-shaped in a front view. The treating tank 30 includes a collecting pan 31 disposed around upper positions of side walls 30b for collecting a treating liquid over-flowing the treating tank 30. A drain pipe 32 is connected to the collecting pan 31 for withdrawing the treating liquid therefrom to a drain 33. The bottom 30a of treating tank 30 includes a drain port 34. The drain port 34 is connected to the drain pipe 32 through piping 36 having a switch valve 35 mounted thereon. By opening the switch valve 35, the treating liquid may be discharged from the bottom of treating tank 30 to the drain 33.

The treating tank 30 has a support 37 disposed therein for supporting a plurality of wafers W arranged at predetermined intervals. This support 37 is vertically movable by a lift mechanism not shown.

The treating tank 30 has two treating liquid injection pipes 1A attached thereto so as to interconnect the bottom 30a and side walls 30b. Each injection pipe 1A defines treating liquid jet bores 2 directed to the interior of treating tank 30. The jet bores 2 are arranged to jet out the treating liquid in a direction inclined slightly downward from a horizontal plane. The treating liquid injection pipes 1A will be described in detail hereinafter.

Bifurcated ends of a treating liquid supply pipe 40 are connected to proximal ends 3 of the injection pipes 1A, respectively. The treating liquid is supplied from a treating liquid source 41 to the injection pipes 1A through the supply pipe 40.

Where a single treating liquid is used in the treatment in the treating tank 30 (e.g. cleaning treatment with only deionized water or a single chemical solution), the liquid source 41 is adapted to supply the single treating liquid. Where a plurality of treating liquids are used in the treatment in the treating tank 30 (e.g. cleaning treatment with deionized water and a chemical solution), the liquid source 41 is adapted to supply the treating liquids selectively.

The treating tank 30 (bottom 30a, side walls 30b, collecting pan 31 and so on) and treating liquid injection pipes 1A are formed, for example, of quartz, PVC (polyvinyl chloride), PEEK (polyether ether ketone), PTFE (polytetrafluoroethylene) or PVDF (polyvinylidene fluoride).

Figure 5:
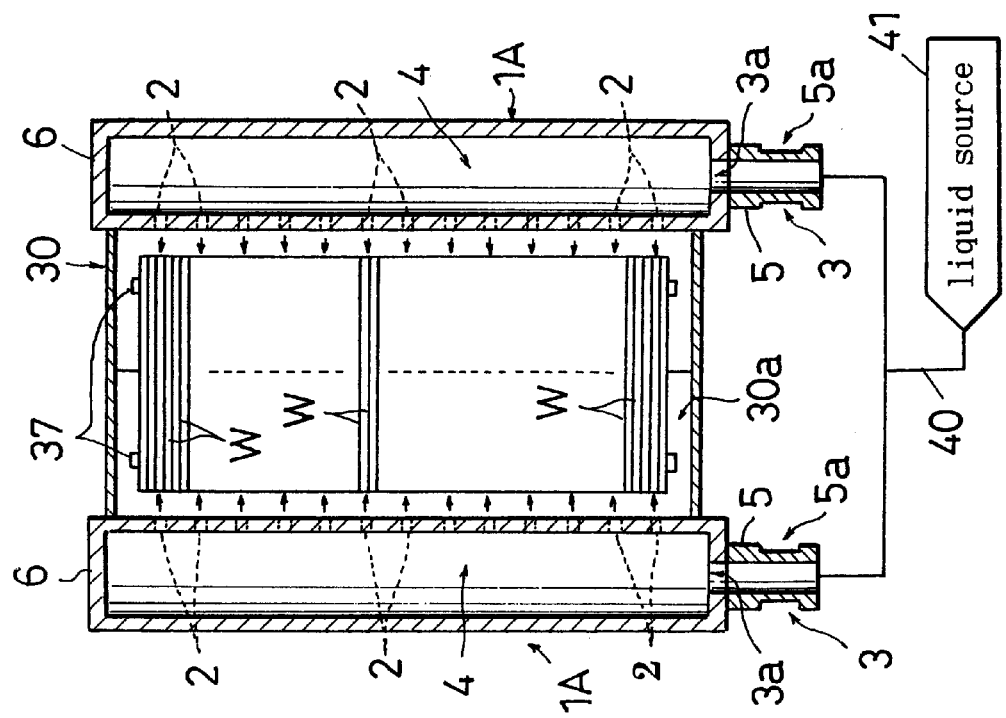
FIG. 5 is a view in cross section of the treating tank in the first embodiment.
Figure 6:
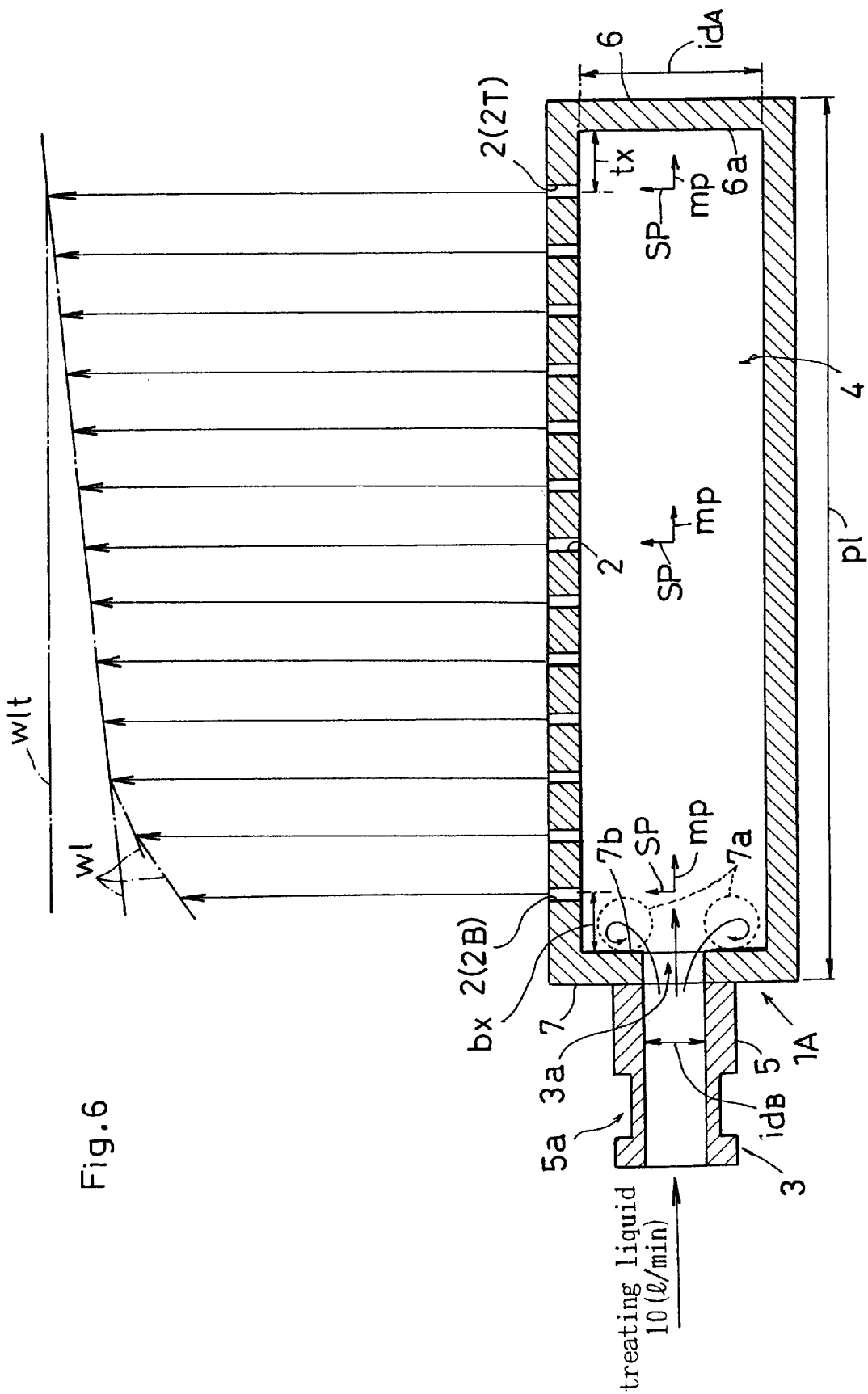
FIG. 6 is a sectional view of an injection pipe attached to the treating tank in the first embodiment.

As shown in FIGS. 5 and 6, each of the treating liquid injection pipes 1A which constitute the gist of the present invention includes a liquid jetting pipe portion 4 defining the jet bores 2 and having an inside diameter $id_A$ larger than a bore diameter $id_B$ of a liquid inlet 3a formed at the proximal end 3 for introducing the treating liquid into the liquid jetting pipe portion 4. In the illustrated construction, the liquid inlet 3a has a thin pipe 5 connected thereto and defining a joint 5a for coupling to the treating liquid supply pipe 40. The thin pipe 5 has the same inside diameter as the bore diameter $id_A$ of liquid inlet 3a. Each injection pipe 1A (liquid jetting pipe portion 4) has a closed distal end 6, and a closed shoulder 7 around the liquid inlet 3a.

Where each injection pipe 1A having the above construction is formed of quartz, for example, a pipe with the large inside diameter to act as the liquid jetting pipe portion 4 and the thin pipe 5 with the small inside diameter may be manufactured separately and joined together such as by welding.

The head length of the treating liquid jetting from each jet bore of the liquid injection pipes is determined by a relationship between dynamic pressure and static pressure of the treating liquid in the liquid jetting pipe portions. The dynamic pressure is a pressure acting in the flowing direction of the treating liquid in the pipe portions, and dependent on the flow velocity of the treating liquid therein. On the other hand, the static pressure is a pressure (jet pressure) acting perpendicular to the dynamic pressure, i.e. in the direction in which the treating liquid jets from each jet bore. The head length of the treating liquid jetting from each jet bore is dependent on the static pressure. According to Bernoulli's theorem, the sum of the dynamic pressure and static pressure is constant.

Figure 2:
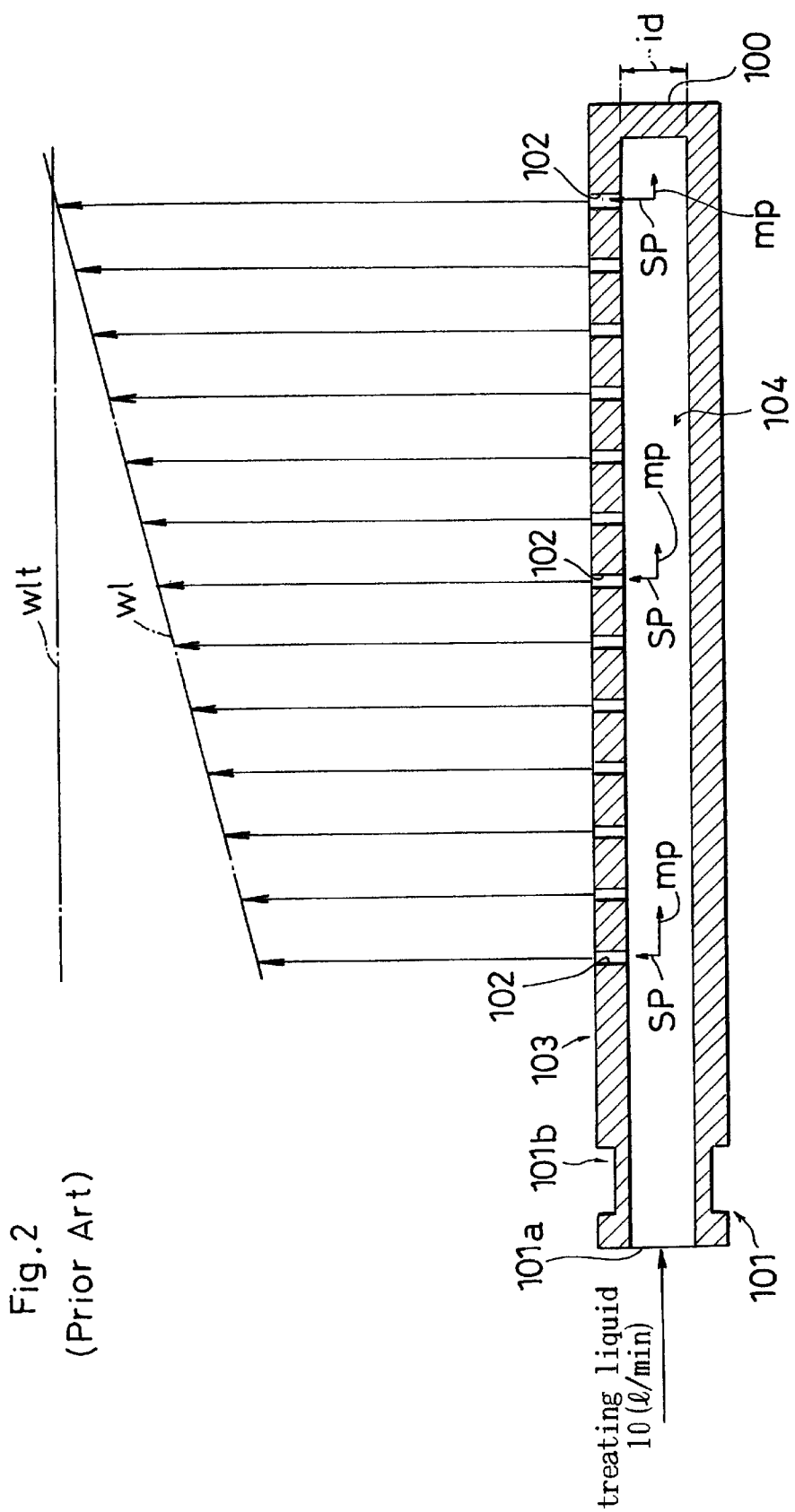
FIG. 2 is a sectional view showing a drawback of the conventional injection pipe.

As shown in FIG. 2, each treating liquid injection pipe 103 used conventionally has a closed distal end 100, and a constant inside diameter id from the proximal end 101 to the distal end 100. The treating liquid flowing in the pipe has a flow velocity slowing toward the distal end 100, and a dynamic pressure mp lowering toward the distal end 100. On the other hand, the static pressure sp (jet pressure of the treating liquid from each jet bore 102) increases toward the distal end 100 since the sum of dynamic pressure mp and static pressure sp is constant. As a result, the head lengths wl of the treating liquid jetting from the jet bores 102 increase toward the distal end 100.

By contrast, with the treating liquid injection pipes 1A attached to the treating tank 30 in this first embodiment, the treating liquid flows through the liquid inlets 3a having the small bore diameter $id_B$ into the liquid jetting pipe portions 4 having the larger diameter $id_A$. Compared with the conventional treating liquid injection pipes 103 having the constant inside diameter id throughout, the construction in the first embodiment suppresses variations in the dynamic pressure mp in the liquid jetting pipe portions 4. As a result, substantially the same static pressure sp of the treating liquid occurs in the jet bores 2 (i.e. jet pressure of the treating liquid from the jet bores 2), thereby suppressing variations in the head length wl of the treating liquid jetting from the jet bores 2.

The injection pipe 1A shown in FIG. 6 has the thin pipe 5 connected thereto. A similar effect may be produced by a construction with the thin pipe 5 omitted from the injection pipe 1A shown in FIG. 6. Specifically, in the latter construction, the pipe (liquid jetting pipe portion 4) has a closed distal end 6 and a closed proximal end 3, and numerous jet bores 2 arranged along a side thereof. A liquid inlet 3a is defined by an opening formed in the closed wall at the proximal end to have a bore diameter smaller than the inside diameter ($id_A$) of the pipe.

An experiment was carried out by using the injection pipes 1A constructed as shown in FIG. 6, to determine states of the treating liquid jetting from the jet bores 2. It has been confirmed that, as shown in FIG. 6, variations in the head length wl of the treating liquid jetting from the jet bores 2 are suppressed in this construction, compared with the conventional injection pipes 103 (see FIG. 2).

In this experiment, the inside diameter $id_A$ of liquid jetting pipe portions 4 was 30 mm, and the bore diameter $id_B$ of the liquid inlets 3a was 16 mm. The number of jet bores 2, the intervals between the jet bores 2, the distance tx between the inner wall 6a of each distal end 6 and the jet bore 2 ($2_T$) closest to the distal end 6, and the flow rate of the treating liquid introduced through the liquid inlets 3a (10 l/min) were the same as in the experiment using the conventional injection pipes 103. Each liquid jetting pipe portion 4 used in the experiment had the same length pl (360 mm) as the conventional injection pipes 103.

As noted above, the injection pipes 1A constructed as shown in FIG. 6 are improved to uniform the head lengths wl of the treating liquid jetting from the jet bores 2. According to the treating tank 30 in the first embodiment having such injection pipes 1A attached thereto, the treating liquid jets from the jet bores 2 into the treating tank 30 with a uniform condition to perform uniform treatment of a plurality of wafers W.

In the treating tank 30 in the first embodiment, a plurality of wafers W may be supported by the support 37 as immersed in deionized water jetted from the jet bores 2 of injection pipe 1A and filling the treating tank 30. Then, a chemical solution such as of hydrofluoric acid may be jetted from the jet bores 2 of injection pipes 1A to replace the deionized water in the treating tank 30 and perform an etching process, for example. In this case, jets of the chemical solution from the jet bores 2 of each injection pipe 1A have head lengths wl made substantially uniform. Consequently, the replacement of the deionized water by the chemical solution progresses uniformly throughout the treating tank 30. This suppresses variations in the etching amount among the wafers W to perform uniform treatment of wafers W.

According to the treating tank 30 in the first embodiment, the plurality of wafers W may be treated with a single predetermined treating liquid, as supported by the support 37 and immersed in the treating liquid jetted from the jet bores 2 of injection pipe 1A and filling the treating tank 30, with the same treating liquid continuously jetting from the jet bores 2 of injection pipes 1A. In this case also, jets of the treating liquid from the jet bores 2 of each injection pipe 1A have head lengths wl made substantially uniform. Consequently, the wafers W are treated with the same treating condition to realize a uniform result of treatment.

Second Embodiment

Figure 7:
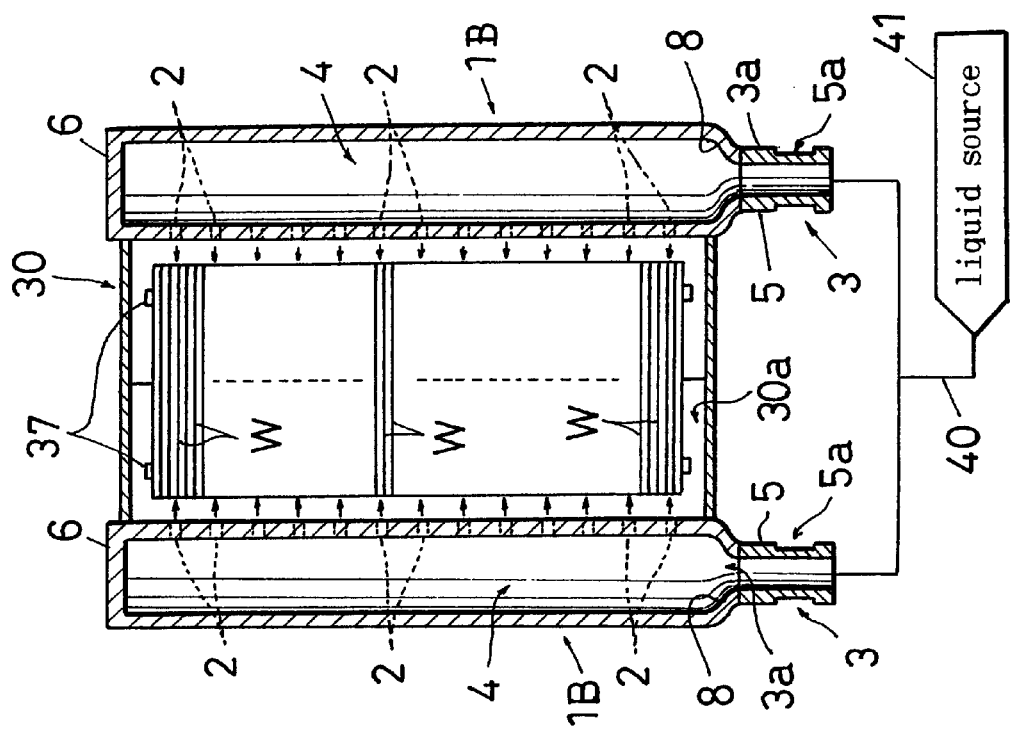
FIG. 7 is a view in cross section of a treating tank in a second embodiment.
Figure 8:
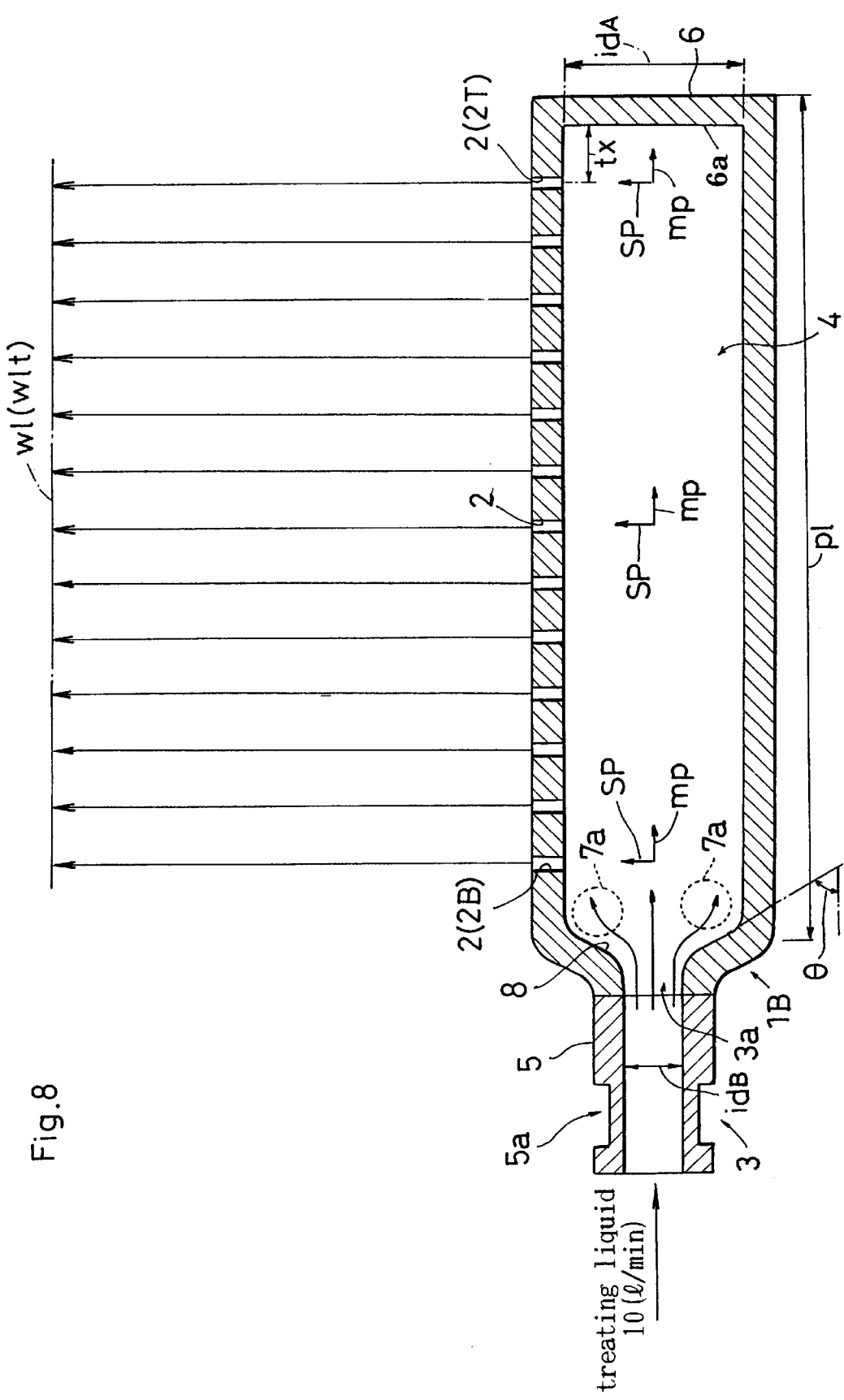
FIG. 8 is a sectional view of an injection pipe attached to the treating tank in the second embodiment.

In the second embodiment, as shown in FIGS. 7 and 8, the treating tank 30 has, attached to the bottom thereof, treating liquid injection pipes 1B which are an improvement upon the injection pipes 1A described in the first embodiment. Each of these injection pipes 1B includes a sloping pipe portion 8 with an inside diameter gradually increasing from the liquid inlet 3a to the liquid jetting pipe portion 4. The other aspects of the overall construction of treating tank 30 are the same as in the first embodiment, and will not particularly be described. Like reference numerals are used to identify like parts of the injection pipes 1A described in the first embodiment and shown in FIGS. 5 and 6, and will not be described again.

In each injection pipe 1A attached to the treating tank 30 in the first embodiment, as shown in FIG. 6, a slight disorder occurs with the head length wil of the treating liquid jetting from the jet bores 2 adjacent the proximal end 3.

Inventors studied the cause of such disorder in the head length wl of the treating liquid jetting from the jet bores 2 adjacent the proximal end 3 of the injection pipe 1A shown in FIG. 6. It has been found as a result that, with the injection pipe 1A shown in FIG. 6, turbulence occurs in the treating liquid flowing from the liquid inlet 3a to the liquid jetting pipe portion 4, in a pipe interior region 7a inwardly of the shoulder 7 around the liquid inlet 3a. It is believed that the turbulence causes the disorder in the head lengths wl of the treating liquid jetting from the jet bores 2 adjacent the proximal end 3.

One conceivable solution is to secure a sufficient distance bx (see FIG. 6) between the jet bore 2 ($2_B$) closest to the proximal end 3 and the inner wall 7b of shoulder 7. Then, the treating liquid jetting from the jet bores 2 adjacent the proximal end 3 may be free from the influence of the turbulence occurring in the treating liquid in the pipe interior region 7a inwardly of the shoulder 7. The disorder in the head lengths wl is expected to disappear as a result. However, the injection pipes are attached to the treating tank whose overall construction, and an overall construction of a substrate treating apparatus incorporating the treating tank, may impose a limitation on the overall length of the injection pipes.

Thus, Inventors have worked on an improvement in the injection pipe 1A shown in FIG. 6 in order to suppress the turbulence occurring in the treating liquid in the pipe interior region 7a inwardly of the shoulder 7 while reducing the distance bx as much as possible. Inventors have made an injection pipe 1B including a sloping pipe portion 8 with an inside diameter gradually increasing from the liquid inlet 3a to the liquid jetting pipe portion 4 as shown in FIGS. 7 and 8, and experimented in jetting of the treating liquid from the jet bores 2.

The injection pipe 1B used in the experiment included a sloping pipe portion 8 having an inclination angle θ at approximately 60°. The other details, i.e. the inside diameter $id_A$ of liquid jetting pipe portion 4, the bore diameter of liquid inlet 3a, the inside diameter $id_B$ of thin pipe 5, the length pl of liquid jetting pipe portion 4, the number of jet bores 2, the intervals between jet bores 2 and the distance tx, were the same as in the injection pipe 1A shown in FIG. 6. The flow rate of the treating liquid introduced through the liquid inlet 3a was the same 10 l/min as in the experiments carried out with the injection pipes 103 and 1A shown in FIGS. 2 and 6. The inclination angle θ may be smaller or larger than 60° as long as it is smaller than 90°. The smaller inclination angle is the better with a view to suppressing turbulence.

FIG. 8 shows results of the experiment which demonstrate that hardly any disorder occurs with the head lengths wl of the treating liquid jetting from the jet bores 2 adjacent the proximal end 3. Overall, variations in the head length wl of the treating liquid jetting from the jet bores 2 are suppressed more effectively than in the injection pipe 1A shown in FIG. 6. Presumably, this effect is realized as a result of variations in the dynamic pressure mp of the treating liquid in the liquid jetting pipe portion 4 being suppressed by suppressing turbulence of the treating liquid in the pipe interior region 7a inwardly of the shoulder 7.

Figure 9A:
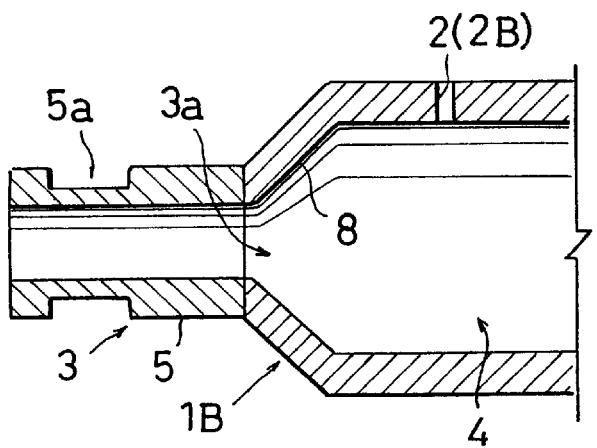
FIGS. 9A through 9C are sectional views of modified sloping pipe portions.
Figure 9B:
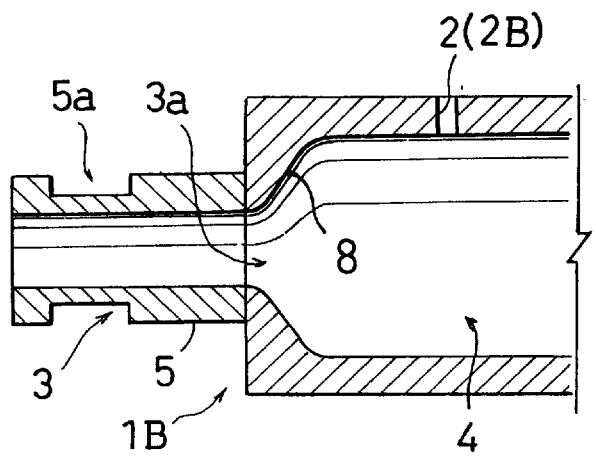
Figure 9C:
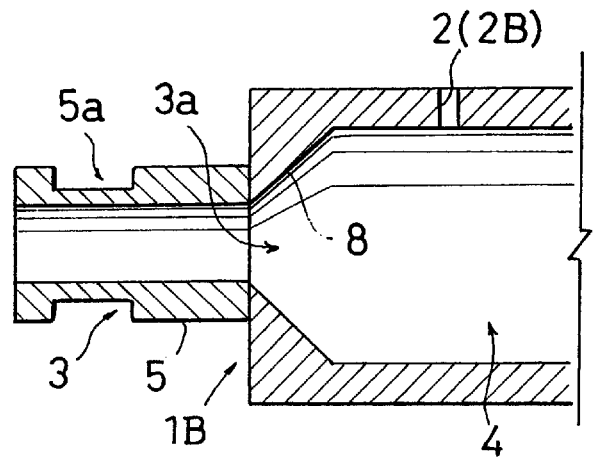

It will serve the purpose as long as the sloping pipe portion 8 has an inside diameter gradually increasing from the liquid inlet 3a to the liquid jetting pipe portion 2. The sloping pipe portion 8 may be shaped otherwise than what is shown in FIGS. 7 and 8 where the inside diameter gradually increases in a curve. As shown in FIG. 9A, for example, the sloping pipe portion 8 may have a sectional shape with the inside diameter increasing linearly, i.e. a tapered configuration. Further, since the sloping pipe portion 8 is required only to have a gradually increasing inside diameter, the pipe profile need not follow the inside diameter. The sloping pipe portion 8 may be modified as shown in FIGS. 9B and 9C. The sloping pipe portions 8 shown FIGS. 9A through 9C produce the same effect as in the injection pipe 1B shown in FIGS. 7 and 8.

The injection pipes 1A and 1B described in the first and second embodiments are not limited to cylindrical pipes, but may be angular pipes as in modifications shown in FIGS. 18A through 18D which will be described in the third embodiment.

According to this injection pipe 1B, jets of the treating liquid from the jet bores 2 have head lengths wl made still more uniform than where the injection pipe 1A is used. Consequently, the treating tank 30 employing the injection pipes 1B assures treatment of wafers W with increased uniformity.

Third Embodiment

Figure 10:
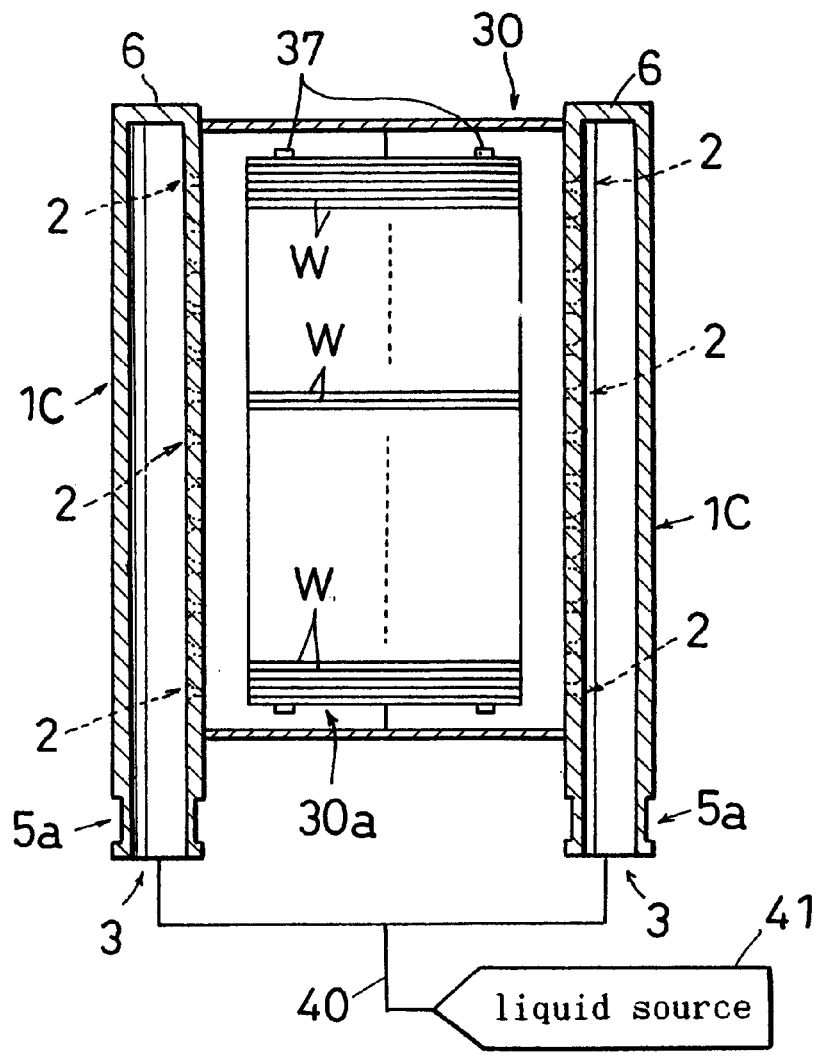
FIG. 10 is a view in cross section of a treating tank in a third embodiment.
Figure 11:
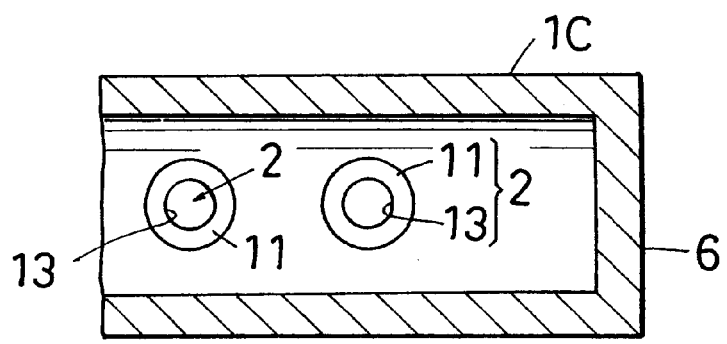
FIG. 11 is a view, seen from inside, of treating liquid jet bores of an injection pipe attached to the treating tank in the third embodiment
Figure 12:
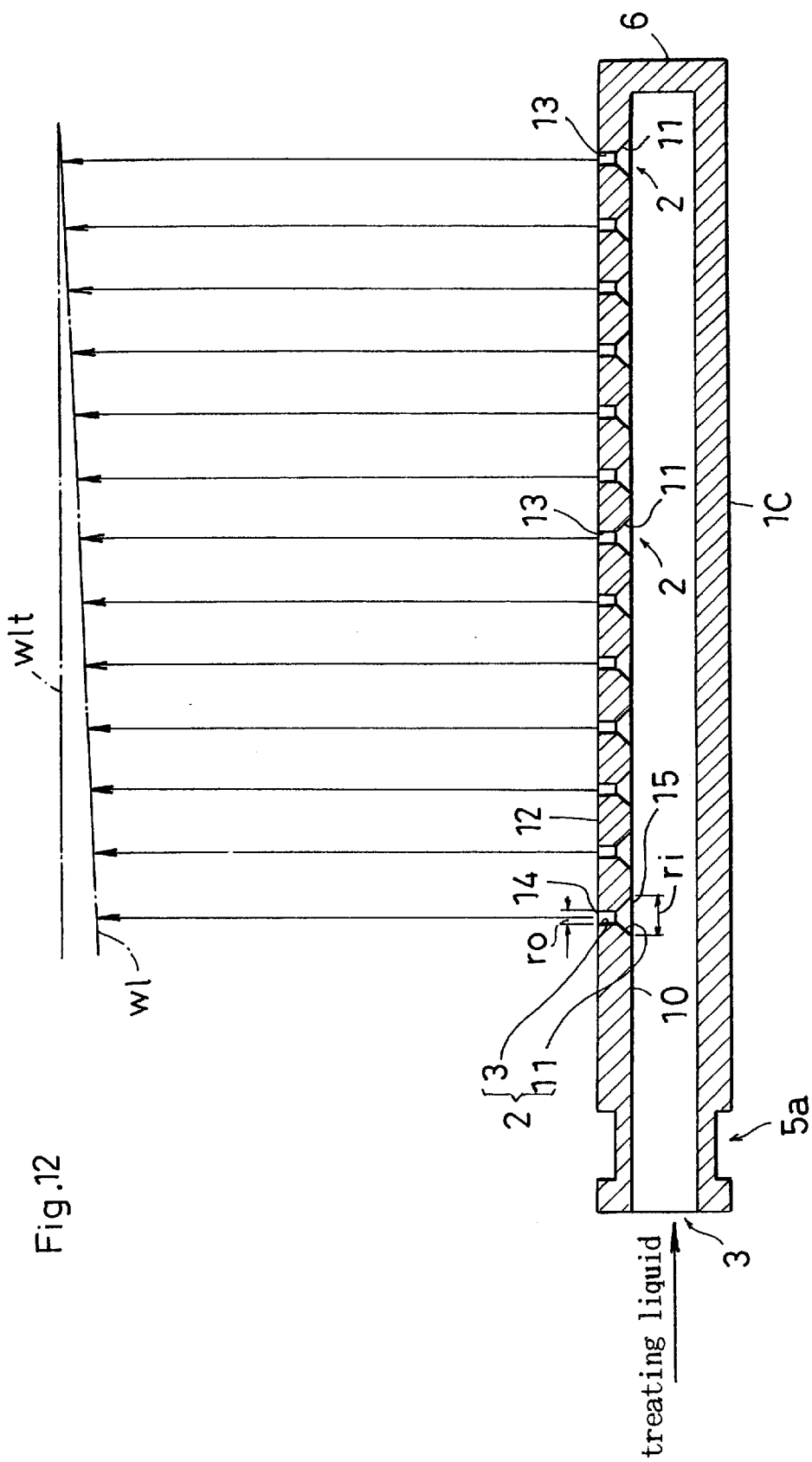
FIG. 12 is a sectional view of the injection pipe attached to the treating tank in the third embodiment.

In the third embodiment, as shown in FIGS. 10 through 12, the treating tank 30 has injection pipes 1C with improved jet bores 2 attached to the bottom thereof. The other aspects of the overall construction of treating tank 30 are the same as in the first embodiment, and will not particularly be described. Like reference numerals are used to identify like parts of the injection pipes 1A described in the first embodiment and shown in FIGS. 5 and 6, and will not be described again.

Each injection pipe 1C defines jet bores 2 each including a tapered slope portion 11 with a bore diameter gradually decreasing from an inner pipe wall 10 toward an outer pipe wall 12. A straight cylindrical portion (with a constant bore diameter) 13 is formed to extend from the slope portion 11 to the outer pipe wall 12.

With this construction, each jet bore 2 has an inside diameter ri at an inlet 15 formed in the inner pipe wall 10 larger than an inside diameter ro at an outlet 14 formed in the outer pipe wall 12. Thus, the treating liquid flows easily into each jet bore inlet 15, thereby suppressing variations in the pressure of the treating liquid jetting from the jet bores 2. As a result, as shown in FIG. 12, variations in the head length wl of the treating liquid jetting from the jet bores 2 are suppressed, compared with the conventional injection pipes 103 (see FIG. 2).

Figure 13A:
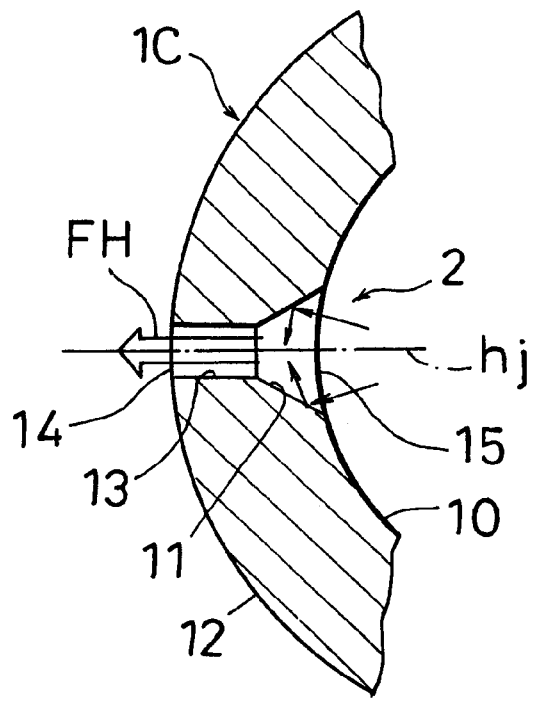
FIGS. 13A and 13B are an enlarged view in vertical section and an enlarged view in cross section of a treating liquid jet bore in the injection pipe attached to the treating tank in the third embodiment.
Figure 13B:
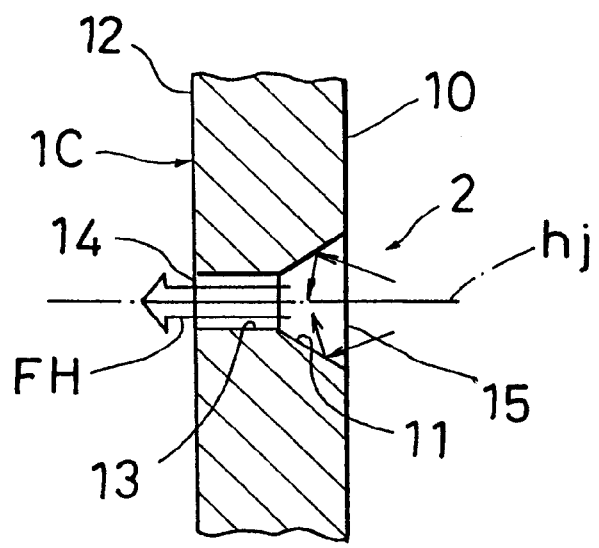

As shown in FIGS. 13A and 13B, streams flowing in varied directions of the treating liquid entering the inlet 15 of each jet bore 2 (indicated by arrows) collide with the peripheral wall of slope portion 11. The streams other than that following the axis hj of jet bore 2 interfere with and counterbalance one another. These streams ultimately converge to a treating liquid jetting direction FH in alignment with the axis hj of jet bore 2. Variations in the direction of the treating liquid jetting from each jet bore 2 into the treating tank 30 are suppressed, which is advantageous in uniforming the head lengths wl of the treating liquid jetting from the jet bores 2.

Figure 14A:
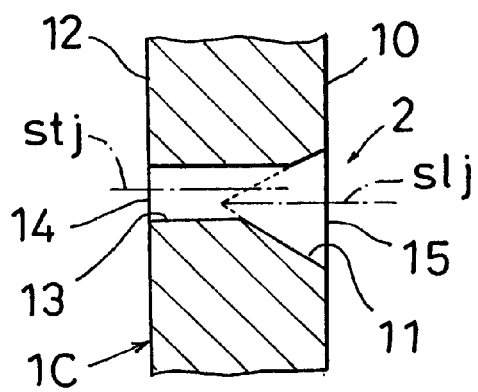
FIGS. 14A through 16B are views showing varied configurations of treating liquid jet bores.
Figure 14B:
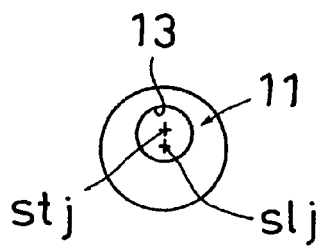
Figure 15A:
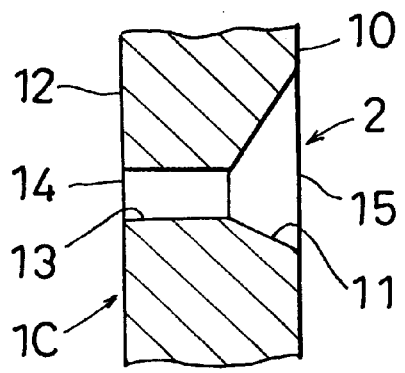
Figure 15B:
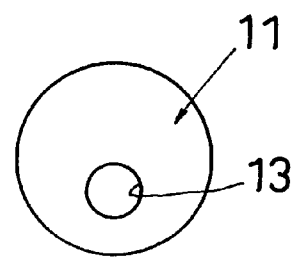
Figure 16A:
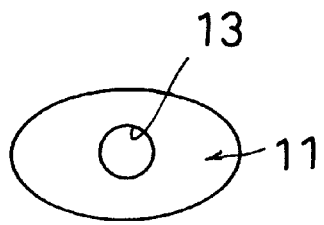
Figure 16B:
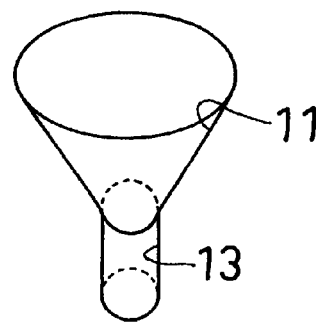

Variations in the head length wl can be suppressed where the inside diameter ri of jet bore inlets 15 is larger than the inside diameter ro of jet bore outlets 14. As shown in FIGS. 14A and 14B, for example, the axis slj of slope portion 11 may be displaced from the axis stj of straight portion 13. As shown in FIGS. 15A and 15B, the peripheral wall of the slope portion may have inclination angles vertically or sideways asymmetrical as seen from the pipe interior. These configurations can suppress variations in the head length wl to a certain extent. However, with the configurations shown in FIGS. 14A through 15B, streams flowing in varied directions of the treating liquid entering the jet bore inlet 15 and colliding with the peripheral wall of slope portion 11 would be deflected in directions so diversified that the streams fail to counterbalance one another. Consequently, the treating liquid jetting direction could deviate from the axis of jet bore 2. Variations in the direction of the treating liquid jetting from each jet bore 2 into the treating tank 30 could not be suppressed to the full extent, resulting in variations in the head length wl of the treating liquid jetting from the jet bores 2. It is therefore desirable to form the slope portion 11 coaxial with the straight portion 13, with the peripheral wall of the slope portion 11 having an inclination angle vertically or sideways symmetrical as seen from the pipe interior. The slope portion 11 is not limited to a conical shape to provide the peripheral wall having an inclination angle vertically or sideways symmetrical as seen from the pipe interior. As shown in FIGS. 16A and 16B, for example, the slope portion 11 may be elliptical as seen from the inner wall of injection pipe 1C.

As noted above, each injection pipe 1C attached to the treating tank 30 has the effect of suppressing variations in the head length wl of the treating liquid jetting from the jet bores 2. The treating liquid jets from the jet bores 2 of each injection pipe 1C into the treating tank 30 with a more uniform condition than in the conventional treating tank, thereby to perform uniform treatment of a plurality of wafers W.

Figure 17A:
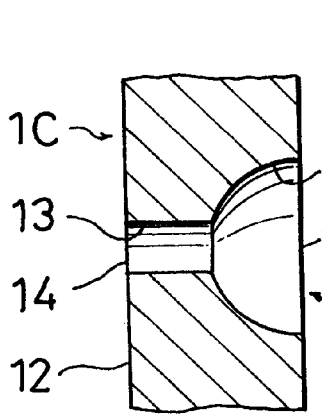
FIGS. 17A through 17C are sectional views of modified slope portions of the treating liquid jet bores.
Figure 17B:
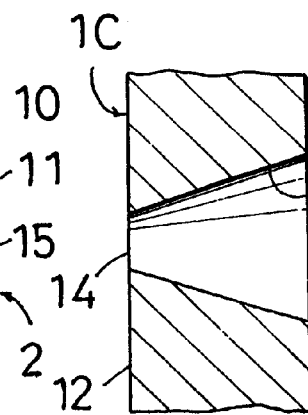
Figure 17C:
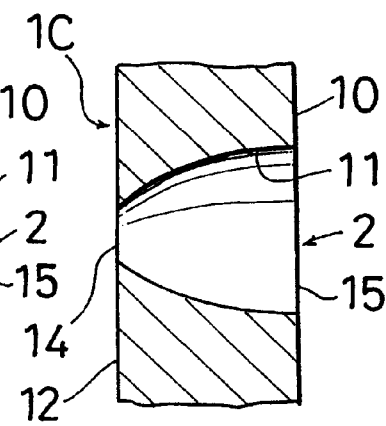

In the third embodiment described above, the slope portion 11 is tapered (i.e. shaped to have the inside diameter changing linearly as seen in a sectional view). As shown in FIG. 17A, the slope portion 11 may have a rounded shape, i.e. shaped to have the inside diameter changing in a curve as seen in a sectional view, to produce a similar effect to the injection pipes 1C in the third embodiment. In the third embodiment, each jet bore 2 includes the slope portion 11 and straight portion 13. As shown in FIGS. 17B and 17C, each jet bore 2 may include only the slope portion 11 to produce a similar effect to the injection pipes 1C in the third embodiment. Where each jet bore 2 is shaped as shown in FIGS. 17B or 17C, the inside diameter ro and position of the outlet 14 of each shaped jet bore 2 could easily deviate from predetermined diameter and position. That is, where each jet bore 2 includes only the slope portion 11, it is difficult to form the outlet 15 of each shaped jet bore 2 to have the predetermined inside diameter ro and to form the outlet 15 in the predetermined position. On the other hand, where each jet bore 2 includes the slope portion 11 and straight portion 13, the inside diameter ro and position of the outlet 15 of each jet bore 2 may be adjusted in time of forming the straight portion 13 after forming the slope portion 11. Thus, from the shaping point of view, each jet bore 2 should desirably includes the slope portion 11 and straight portion 13.

Figure 18A:
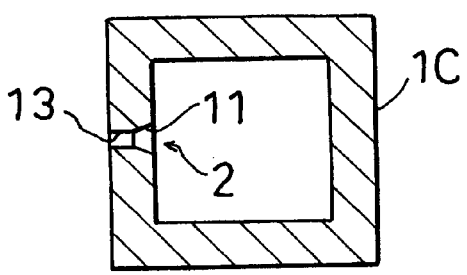
FIGS. 18A through 18D are sectional views of modified injection pipes.
Figure 18B:
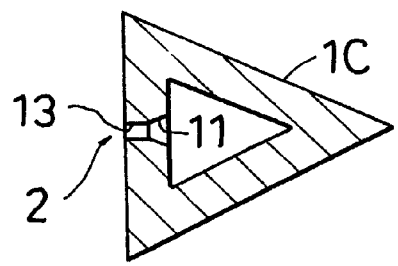
Figure 18C:
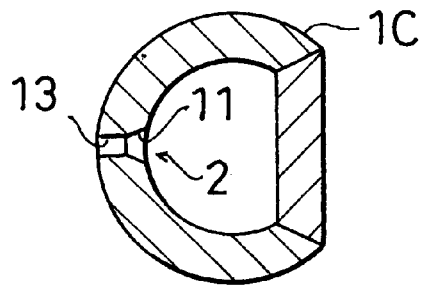
Figure 18D:
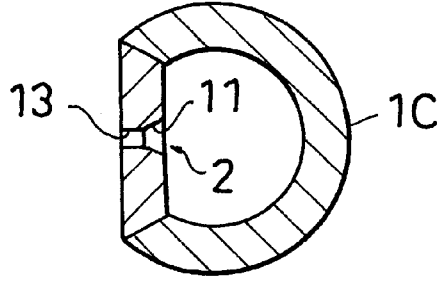

Each injection pipe 1C is not limited to a round pipe, but may be a polygonal pipe having a rectangular or triangular section as shown in FIGS. 18A or 18B. Further, each injection pipe 1C may have a D-shaped section with an arcuate portion and a linear portion as shown in FIGS. 18C or 18D.

A method of manufacturing the injection pipe 1C with the jet bores 2 each having the slope portion 11 will be described next with reference to FIGS. 19A through 19G. The manufacturing method will be described taking the injection pipe 1C shown in FIG. 18C for example.

The cylindrical jet bores 102 in the conventional injection pipe 103 may be formed by drilling from the outer pipe wall. However, it is impossible to form the jet bores 2 each including the slope portion 11 by drilling from the outer pipe wall 12.

Figure 19A:
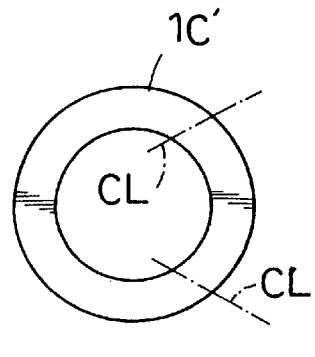
FIGS. 19A through 19G are views showing a method of manufacturing an injection pipe defining the treating liquid jet bores with slope portions.
Figure 19B:
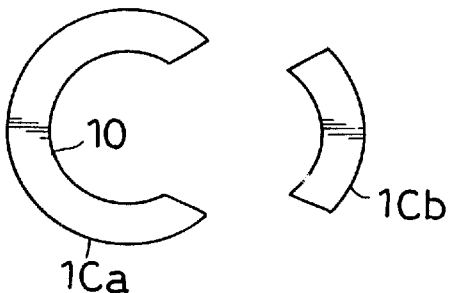
Figure 19C:
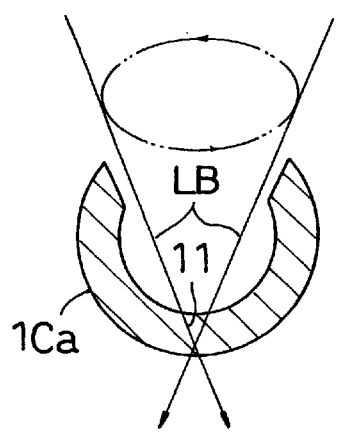
Figure 19D:
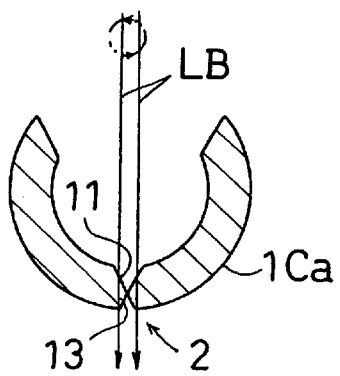
Figure 19E:
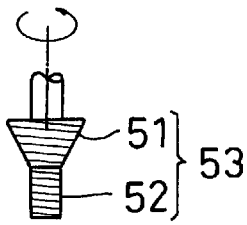
Figure 19F:
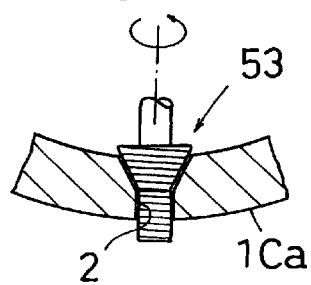
Figure 19G:
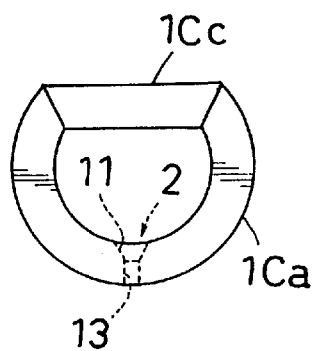

First, a round pipe C' is cut axially along cutting plane lines CL shown in FIG. 19A (in a direction perpendicular to the sheet of the drawings). Consequently, as shown in FIG. 19B, the pipe C' is separated into pipe fragments 1Ca and 1Cb to be shapable from the inner walls 10. The jet bores 2 each including the slope portion 11 are formed in the larger pipe fragment 1Ca. Where each jet bore 2 is formed by laser machining, as shown in FIG. 19C, the slope portion 11 is formed by shifting a laser beam LB to describe a cone. Next, as shown in FIG. 19D, the straight portion 13 is formed by shifting a laser beam LB in a circle, to complete the jet bore 2. Where each jet bore 2 is formed by drilling, a drill 53 having a conical drill part 51 and a cylindrical drill part 52, as shown in FIG. 19E, is used to form each jet bore 2 as shown in FIG. 19F. Where the slope portion 11 is formed into the rounded shape shown in FIG. 17A, the conical drill part 51 shown in FIGS. 19E and 19F may be replaced with a spherical, elliptical or spindle-shaped drill part. Each jet bore 2 may be formed by ultrasonic machining or other appropriate methods. After all the jet bores 2 with slope portions 11 are formed in the pipe fragment 1Ca, as shown in FIG. 19G, a plate-like member 1Cc separately prepared may be joined thereto by welding or otherwise to close the open side of the pipe fragment 1Ca, to obtain the injection pipe 1C shown in FIG. 18C.

The injection pipe 1C shown in FIG. 18D has each jet bore 2 formed in the plate-like member 1Cc.

The injection pipe 1C having a circular cross section throughout may be obtained by joining the remaining pipe fragment 1Cb shown in FIGS. 19A and 19B to the pipe fragment 1Ca having the jet bores 2 formed therein.

The injection pipe 1C having the shape shown in FIGS. 18A or 18B may be manufactured in a similar. That is, a square or triangular pipe is cut to pipe fragments, and the jet bores 2 are formed in one of the pipe fragments. Subsequently, the open side of the pipe fragment having the jet bores 2 is closed.

Fourth Embodiment

Figure 20:
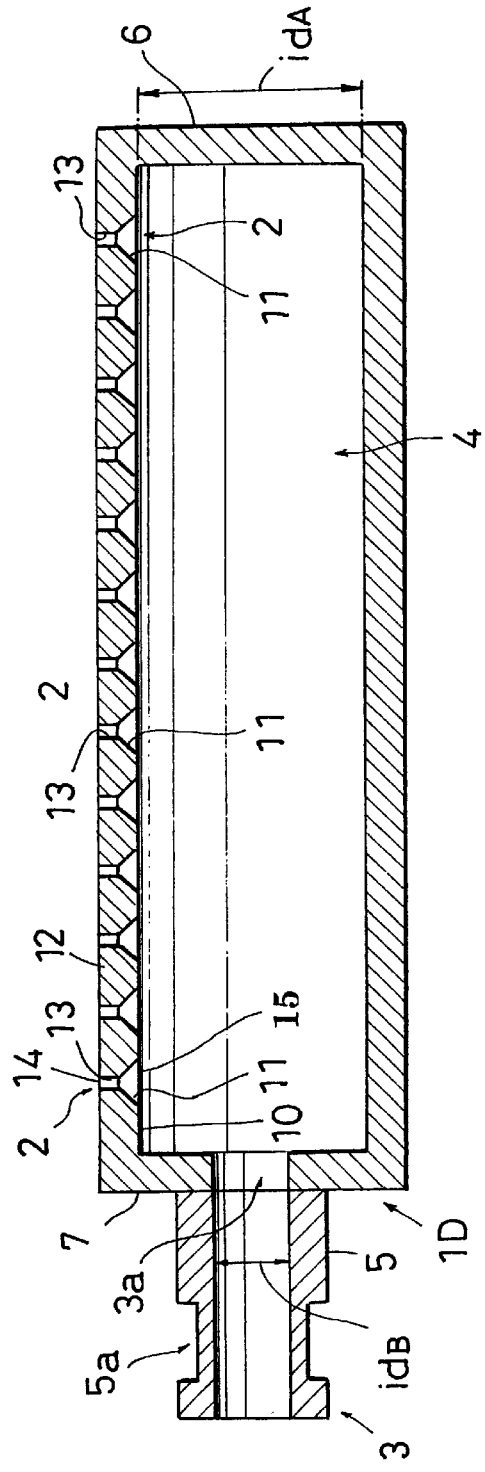
FIGS. 20 and 21 are sectional views of injection pipes attached to a treating tank in a fourth embodiment.
Figure 21:
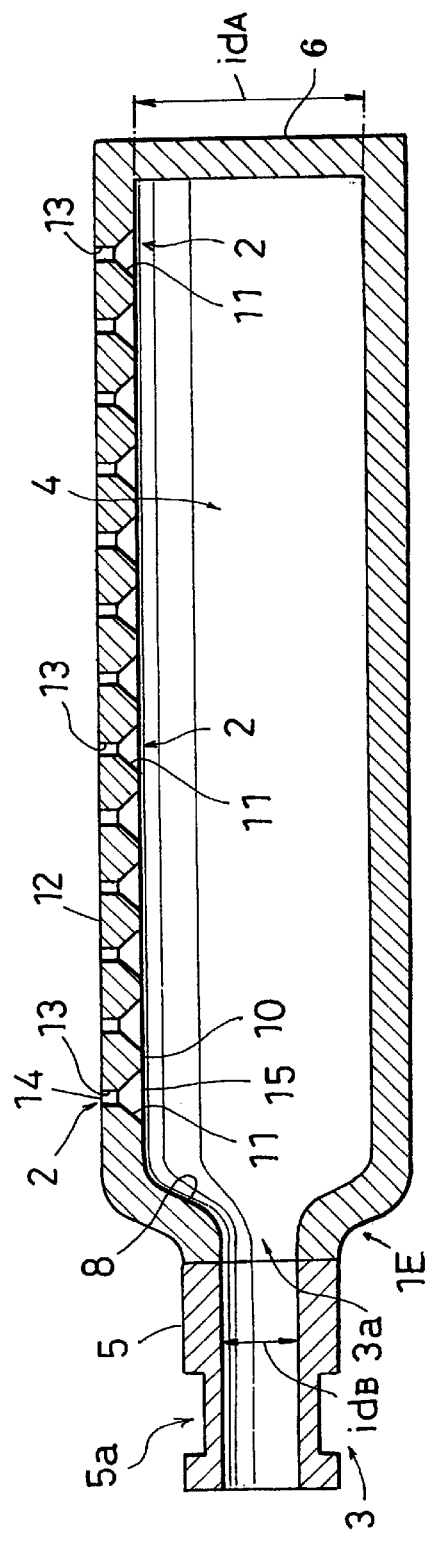

In the fourth embodiment, as shown in FIGS. 20 and 21, injection pipes 1D and 1E attached to the treating tank are improvements on the injection pipes 1A and 1B described in the first and second embodiments, respectively. As shown, the injection pipes 1D and 1E have jet bores 2 each having the slope portion 11 and straight portion 13 as in the injection pipe 1C described in the third embodiment. Like reference numerals are used to identify like parts of the injection pipes 1A, 1B and 1C described in the first, second and third embodiments and shown in FIGS. 6, 8 and 12, and will not be described again.

The injection pipe 1D shown in FIG. 20 has a combination of the function described in the first embodiment and the function described in the third embodiment. With the combined functions, jets of the treating liquid from the jet bores 2 have head lengths wl made still more uniform than where the injection pipe 1A or 1C is used. Consequently, the treating tank 30 employing the injection pipes 1D assures treatment of wafers W with increased uniformity.

The injection pipe 1E shown in FIG. 21 has a combination of the function described in the second embodiment and the function described in the third embodiment. With the combined functions, jets of the treating liquid from the jet bores 2 have head lengths wl made still more uniform than where the injection pipe 1B or 1C is used. Consequently, the treating tank 30 employing the injection pipes 1D assures treatment of wafers W with increased uniformity.

In FIGS. 20 and 21, each jet bore 2 includes the slope portion 11 and straight portion 13. As described in the third embodiment with reference to FIGS. 17B and 17C, each jet bore 2 may include only the slope portion 11. Further, the modifications described in the first, second and third embodiments may be applied to the fourth embodiment also.

Fifth Embodiment

As shown in FIGS. 22 and 23A through 23E, the fifth embodiment provides double pipe structures each including one of the injection pipes 1A–1E described in the first to fourth embodiments to act as an inner pipe, and an outer injection pipe 60 surrounding the inner pipe.

The outer injection pipe 60 has closed opposite ends and second jet bores 61 corresponding in number to and arranged at the same intervals along a side thereof as the jet bores 2 of injection pipe 1A–1E. The second jet bores 61 are formed cylindrical. Each outer injection pipe 60 has the second jet bores 61 directed to the interior of treating tank 30. The second jet bores 61 are arranged to jet out the treating liquid in a direction inclined slightly downward from a horizontal plane. The injection pipe 1A–1E and outer injection pipe 60 are arranged coaxially. The jet bores 2 and second jet bores 61 are displaced relative to each other such that the treating liquid jets therefrom in substantially opposite directions. The jet bores 2 and second jet bores 61 are arranged without axial displacement relative to each other. That is, a corresponding pair of jet bore 2 and second jet bore 61 are arranged on a common axis VJ perpendicular to the pipe axis CJ. Preferably, the second jet bores 61 of outer injection pipe 60 have a larger inside diameter than the outlets 14 of jet bores 2 of injection pipe 1A–1E. The outer injection pipe 60 is formed of the same material as the injection pipe 1A–1E. The other aspects of this embodiments are the same as in the first to fourth embodiments. Like reference numerals are used to identify like parts in FIGS. 3 through 21, and will not be described again.

Figure 22:
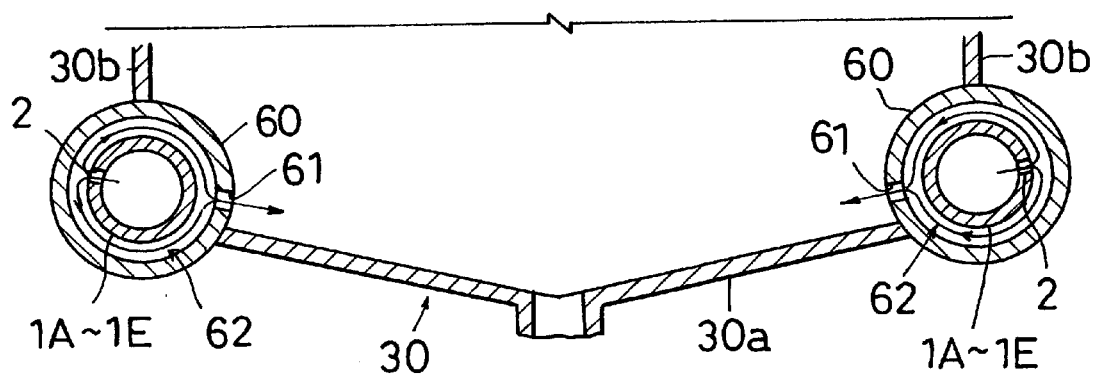
FIG. 22 is a view in vertical section showing a bottom portion of a treating tank in a fifth embodiment.
Figure 23A:
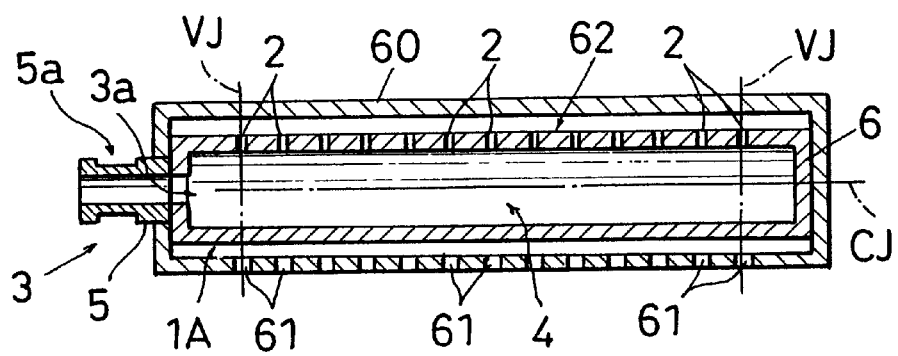
FIGS. 23A through 23E are sectional views of injection pipes and outer injection pipes attached to the treating tank in the fifth embodiment.
Figure 23B:
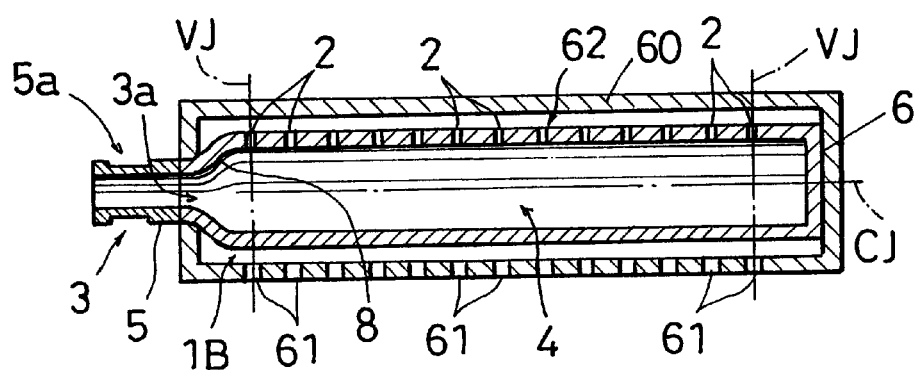
Figure 23C:
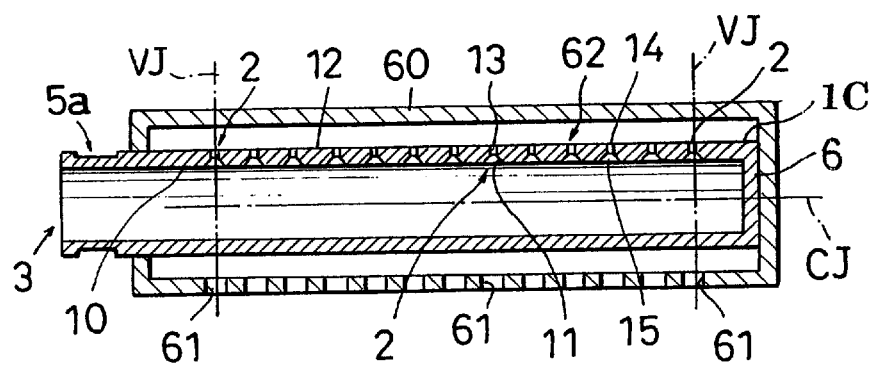
Figure 23D:
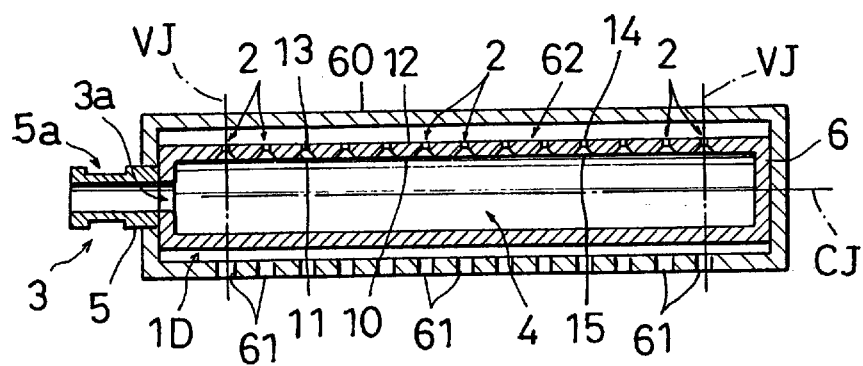
Figure 23E:
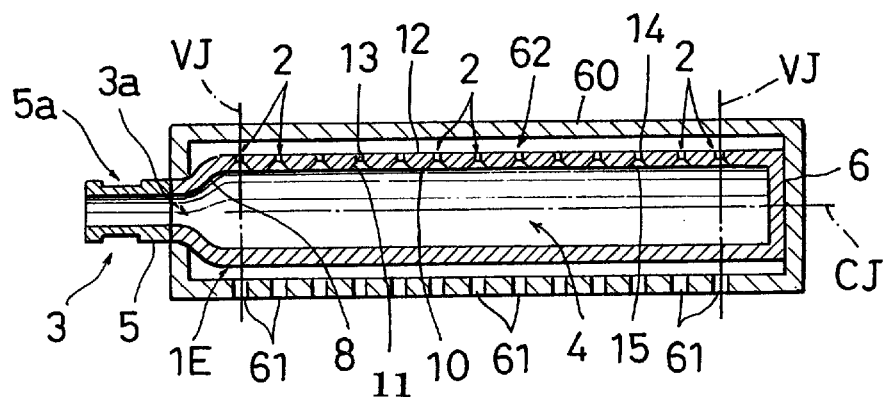

According to this treating tank 30, as shown in FIG. 22, the treating liquid jetting from the jet bores 2 of each inner injection pipe 1A–1E collides with the inner wall of the outer injection pipe 60, whereby the flow velocity (pressure) of the treating liquid is lowered. Then, the streams are divided in two parts, each flowing around in a different direction through the space 62 between the outer wall of inner injection pipe 1A–1E and the inner wall of outer injection pipe 60. The streams join in the second jet bores 61 and jet out of the second jet bores 61 into the treating tank 30. Thus, the streams of the treating liquid are further regulated after jetting from the jet bores 2 of inner injection pipe 1A–1E until jetting from the second jet bores 61 of outer injection pipe 60 into the treating tank 30. This feature produces the effect of further uniforming the head lengths of the treating liquid jetting into the treating tank 30.

Each second jet bore 61 of outer injection pipe 60 in the double pipe structure in the fifth embodiment may also include a slope unit 11 as described in the third embodiment.

The treating tank 30 in each of the foregoing embodiments has the collecting pan 31. The present invention is equally applicable to a treating tank without the collecting pan 31.

Figure 3:
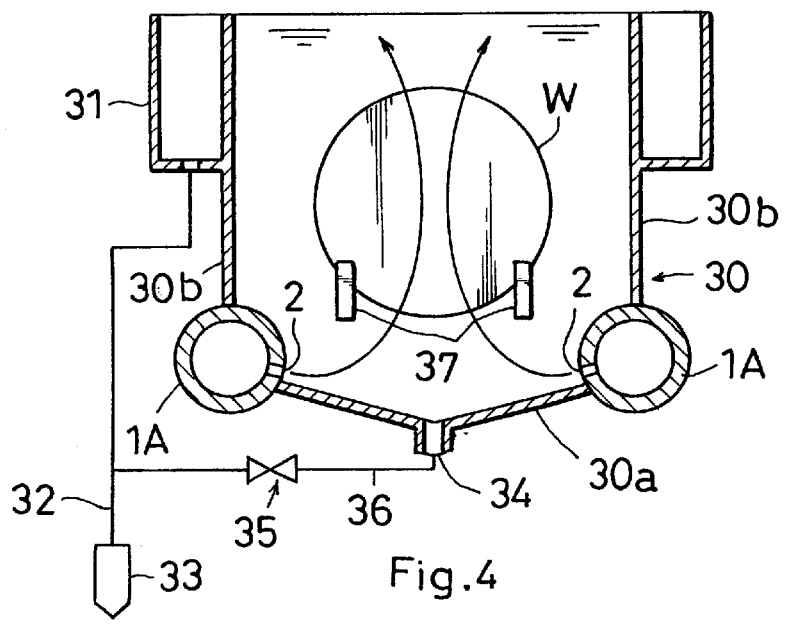
FIG. 3 is a view in vertical section of a treating tank in a first embodiment of the present invention.
Figure 4:
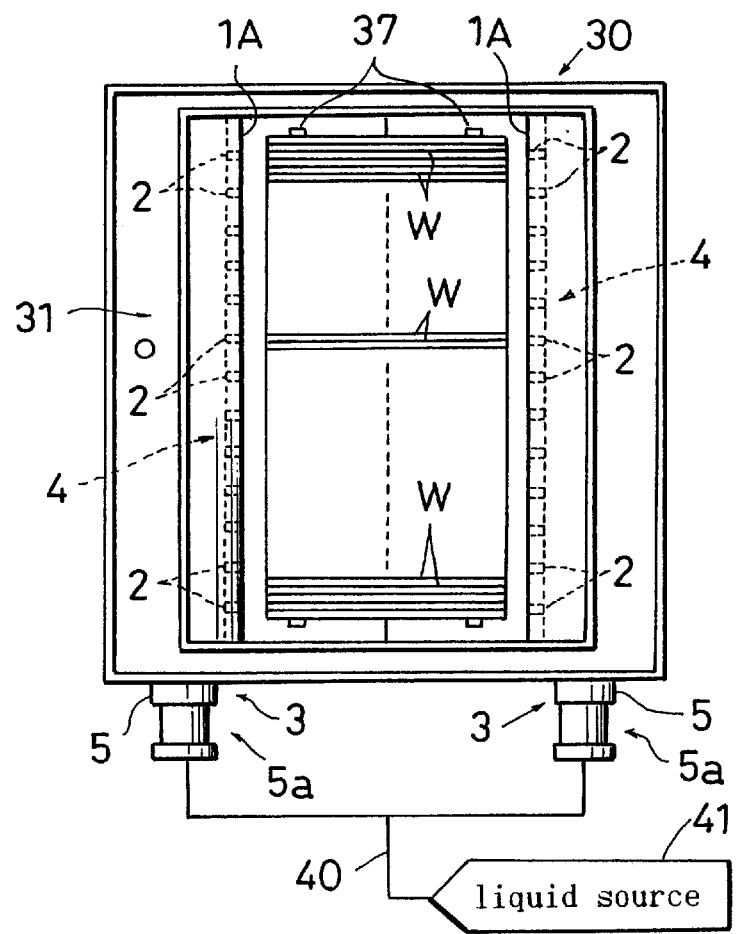
FIG. 4 is a plan view of the treating tank in the first embodiment.

Further, the invention is applicable also to a treating tank having an overall construction different from what is shown in FIGS. 3 and 4. The invention is applicable only if the treating tank includes injection pipes each having a closed distal end and a plurality of jet bores arranged along a side of the pipe for jetting, into the tank, a treating liquid introduced through a proximal end side.

The treating tank 30 in each of the embodiments and modifications described hereinbefore may be employed in various batch type substrate treating apparatus.

Figure 24:
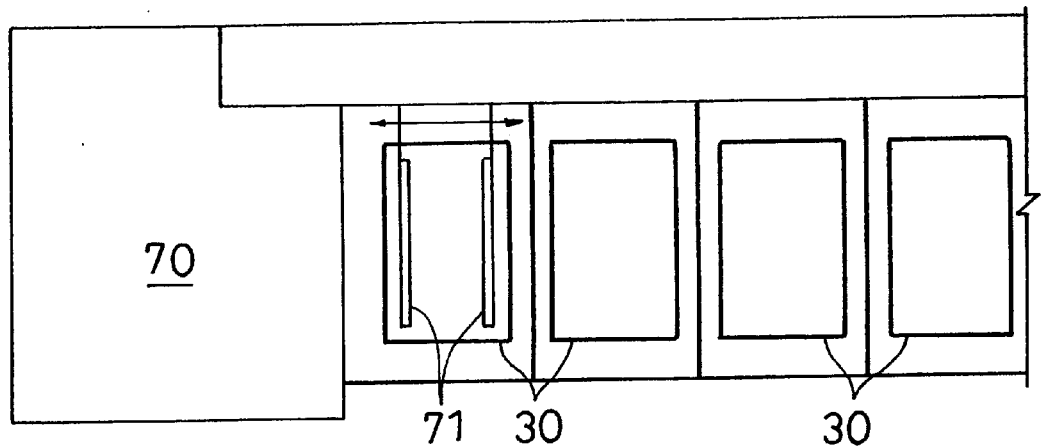
FIGS. 24 and 25 are views showing substrate treating apparatus with treating tanks according to the present invention.

As shown in the plan view of FIG. 24, for example, a plurality of treating tanks 30 in each of the foregoing embodiments and modifications may be employed in a substrate treating apparatus called a wet station for performing varied cleaning treatments for a plurality of wafers. Then, the cleaning treatment may be effected uniformly in each treating tank 30. Numeral 70 in FIG. 24 denotes a loading and unloading section where a plurality of wafers are taken out of a cassette, and cleaned wafers are stored back into the cassette. Numeral 71 denotes a transport device for holding the plurality of wafers taken out of the cassette in the loading and unloading section 70, transporting the wafers successively to the treating tanks 30, and returning the cleaned wafers to the loading and unloading section 70.

Figure 25:
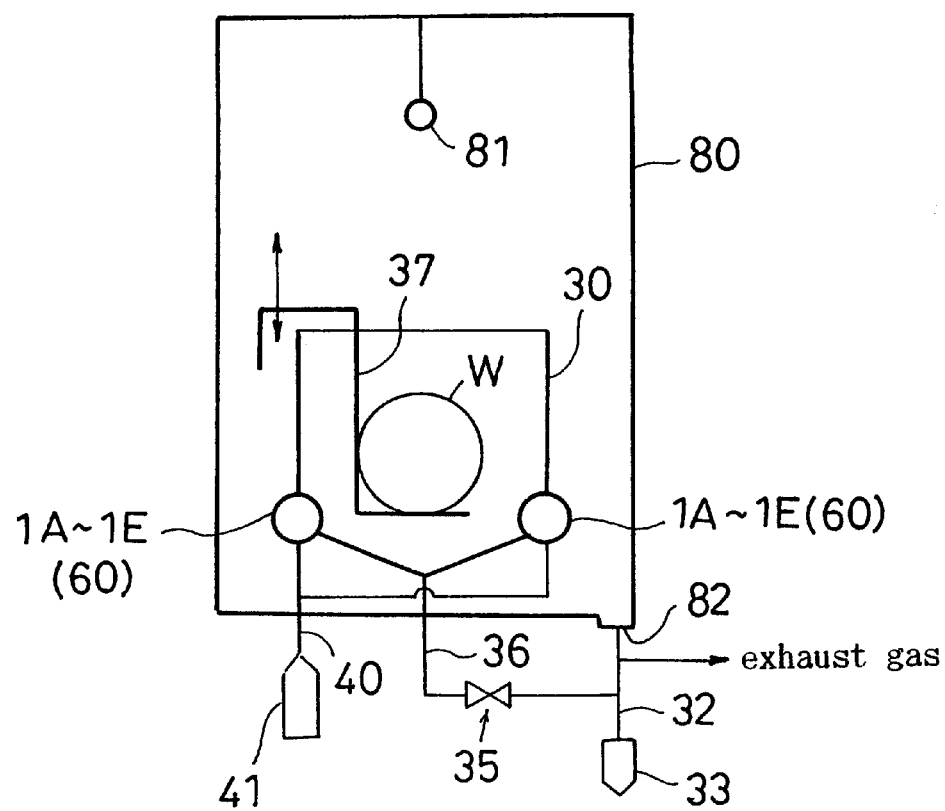

As shown in the view in vertical section of FIG. 25, the treating tank 30 in each of the foregoing embodiments and modifications may be employed as a single treating tank mounted in a sealed chamber 80 of a substrate treating apparatus for performing one or more cleaning treatments of a plurality of wafers W. The wafers W may be cleaned uniformly and dried by supplying, form a nozzle 81, an organic solvent such as IPA (isopropyl alcohol) in the sealed chamber 80 and by decompressing the sealed chamber 80. In FIG. 25, the sealed chamber 80 has an exhaust and drain port 82 formed in the bottom thereof. The treating liquid over flowing the treating tank 30 is allowed to flow inside the sealed chamber 80 before being withdrawn from the exhaust and drain port 82 through a drain pipe 32 into a drain 33. This treating tank 30 does not include the collecting pan 31. However, a treating tank 30 having the collecting pan 31 may be installed in the sealed chamber 80.

Further, one or more treating tanks 30 in each of the foregoing embodiments and modifications may be employed along with a substrate dryer in a substrate treating apparatus. Then, a uniform cleaning treatment may be effected in the treating tank or tanks.

The treating tank or tanks 30 in each of the foregoing embodiments and modifications may be employed in substrate treating apparatus constructed otherwise for performing cleaning treatment, or cleaning and drying treatments.

The treating tanks 30 in the foregoing embodiments and modifications are applicable to substrate treating apparatus which perform other treatments than the cleaning treatment or cleaning and dry treatments. Such treating tanks serve the purpose as long as they include injection pipes each having a closed distal end and a plurality of jet bores arranged along a side of the pipe for jetting, into the tank, a treating liquid introduced through a proximal end side, and they are used to immerse substrate in a treating liquid.

The present invention is applicable to a tank for use in immersing only a single substrate. Where the substrate is immersed with a principal surface thereof disposed parallel to the arrangement of jet bores, the entire surface of the substrate may be treated uniformly.

The present invention may be embodied in other specific forms without departing from the spirit or essential attributes thereof and, accordingly, reference should be made to the appended claims, rather than to the foregoing specification, as indicating the scope of the invention.

What is claimed is:

1. A treating tank for immersing substrates in a treating liquid, comprising:

injection pipes each having a closed distal end, and a plurality of jet bores arranged along a side wall thereof for jetting, into said treating tank, said treating liquid introduced through a proximal end;

wherein each of said injection pipes includes a liquid jetting pipe portion defining said jet bores and having an inside diameter larger than a bore diameter of a liquid inlet formed at said proximal end for introducing said treating liquid into said liquid jetting pipe portion, and each of said injection pipes further includes a sloping pipe portion having an inside diameter gradually increasing from said liquid inlet to said liquid jetting pipe portion.

2. A treating tank as defined in claim 1, wherein each of said jet bores includes a slope portion having an inside diameter gradually decreasing from an inner wall toward an outside of said liquid jetting pipe portion.

3. A treating tank as defined in claim 2, wherein said slope portion has an inside diameter decreasing linearly from said inner wall toward said outside.

4. A treating tank as defined in claim 2, wherein said slope portion has an inside diameter decreasing in a curve from said inner wall toward said outside.

5. A treating tank as defined in claim 2, wherein each of said jet bores further includes a straight portion having a constant inside diameter and communicating said slope portion with an outer wall of said liquid jetting pipe portion.

6. A treating tank as defined in claim 1, wherein each of said injection pipes acts as an inner pipe mounted in an outer injection pipe having a plurality of second jet bores arranged along a side wall thereof for finally jetting said treating liquid into said treating tank, wherein said jet bores of each said injection pipe mounted inside jet out said treating liquid in a direction displaced from a direction in which said treating liquid jets from said second jet bores.

7. A treating tank as defined in claim 1, further comprising support means for supporting said substrates inside said treating tank.

8. A treating tank as defined in claim 1, wherein said sloping pipe portion has an inside diameter increasing in a curve from said liquid inlet to said liquid jetting pipe portion.

9. A treating tank as defined in claim 1, wherein said sloping pipe portion has an inside diameter increasing linearly from said liquid inlet to said liquid jetting pipe portion.

10. A substrate treating apparatus, comprising:

a treating tank for immersing substrates in a treating solution, said treating tank including injection pipes each having a closed distal end, and a plurality of jet bores arranged along a side wall thereof for jetting into said treating tank, said treating liquid introduced through a proximal end;

wherein each of said injection pipes includes a liquid jetting pipe portion defining said jet bores and having an inside diameter larger than a bore diameter of a liquid inlet formed at said proximal end for introducing said treating liquid into said liquid jetting pipe portion, and each of said injection pipes further includes a sloping pipe portion having an inside diameter gradually increasing from said liquid inlet to said liquid jetting pipe portion.

* * * * *